United States Patent [19]

Misic et al.

[11] Patent Number: 5,521,506
[45] Date of Patent: May 28, 1996

[54] ORTHOGONAL ADJUSTMENT OF MAGNETIC RESONANCE SURFACE COILS

[75] Inventors: George Misic, Novelty, Ohio; Eric Reid, Monroeville, Pa.

[73] Assignee: Medrad, Inc., Pittsburgh, Pa.

[21] Appl. No.: 154,414

[22] Filed: Nov. 19, 1993

[51] Int. Cl.$^6$ .................. G01V 3/00; G01V 3/14
[52] U.S. Cl. .................. 324/322; 324/318
[58] Field of Search .................. 324/318, 322, 324/300, 314; 128/653.5

[56] References Cited

U.S. PATENT DOCUMENTS

| | | | |
|---|---|---|---|
| 4,694,225 | 9/1987 | Hayes | 324/318 |
| 4,879,516 | 11/1989 | Mehdizadeh | 324/318 |
| 5,097,210 | 3/1992 | Requardt | 324/318 |
| 5,221,902 | 6/1993 | Jones | 324/318 |
| 5,256,971 | 10/1993 | Boskamp | 324/318 |
| 5,382,903 | 1/1995 | Young | 324/318 |

Primary Examiner—Sandra L. O'Shea
Assistant Examiner—Mack Haynes
Attorney, Agent, or Firm—Keck, Mahin & Cate

[57] ABSTRACT

An NMR magnetic coil system (10) is disclosed wherein the isolation between the coils (16, 18) can be adjusted to decrease or virtually eliminate the coupling between quadrature magnetic resonance imaging coils (16, 18). At least one of the coils (16) is separated into parallel segments (20, 22), located in a critically overlapped area. The capacitance of the segments is adjusted by a differential capacitor (76) to vary the ratio of the RF current flowing through the parallel segments. Appropriate adjustment of the capacitance of these paths (20, 22) causes a sharing of the appropriate amount of the out of phase flux to cancel the balance of the shared flux and therefore results in a net mutual inductance of zero.

24 Claims, 5 Drawing Sheets

ORTHOGONAL ADJUSTMENT OF MAGNETIC RESONANCE SURFACE COILS

TECHNICAL FIELD OF THE INVENTION

This invention relates generally to the field of magnetic resonance imaging technology. Specifically this invention relates to several improved methods for the electrical adjustment of two or more magnetic resonance coils to assure the proper isolation and/or orthogonal relationship of the coil fields in order to increase the signal to noise ratio of the magnetic resonance signal.

BACKGROUND OF THE INVENTION

Quadrature magnetic resonance imaging coils, and more recently, multicoil systems using a plurality of independent data acquisition channels, are generally known in the art. Quadrature magnetic resonance systems offer advantages over previous magnetic resonance imaging techniques in that they provide a better signal to noise ratio by utilizing both component vectors of the circularly polarized field of the magnetic resonance phenomenon, and lower RF transmitter power requirements when used as transmit coils. Multicoil systems offer some or all of the above-noted advantages, plus additional advantages in enhancing the imaging signal to noise ratio due to the reduced imaging volume of each independent coil and data acquisition path in the multicoil system. However, when these systems are used for magnetic resonance imaging, the isolation of the signal currents in one coil mode or coil system from currents in the other mode or coil system must be at a high level to obtain the benefits of quadrature operation, or multicoil operation.

Those skilled in the art will appreciate that it is desirable to reduce or eliminate the inductive coupling between the two coil systems forming the RF quadrature coil used in a magnetic resonance imaging system in order to solve these and other problems. Additionally, it is desirable to reduce or eliminate the inductive coupling betwixt the various coil systems in a multicoil configuration. Ideally there should be no inductive coupling between the coil systems comprising the RF quadrature coil or multicoil system. Previously the adjustment of such coils to minimize the coupling between the coils was accomplished by either the physical movement of the coils or the physical adjustment of a variable element to electrically accomplish the same result.

Changing a single element generally alters the tuning or other coil parameters. In the past, adjusting the isolation or orthogonality of a coil has yielded undesirable secondary adjustment of one or more other coil parameters. Further, if physical adjustment of the location of the coils is employed to accomplish this result, many coil formations are eliminated as a practical matter, thereby dramatically decreasing the versatility of these systems.

While the conventional devices have made significant advances in the art of magnetic resonance imaging, it is clear that much more versatile and useful magnetic resonance imaging systems will result from a quadrature magnetic resonance coil system that can be adjusted, or remotely adjusted, to only optimize the isolation of the coil elements without affecting other operational characteristics.

SUMMARY OF THE INVENTION

The above-noted quadrature coil adjustment problems of conventional systems are solved by the present invention. In accordance with one aspect of the invention, a magnetic resonance coil system includes a first coil, and a second coil having first and second segments configured in parallel. The second coil physically overlaps the first coil. A differential capacitor is provided which contributes a first capacitance in series with the first parallel segment of the second coil and a second capacitance in series with the second parallel segment of the second coil. The differential capacitor is operable to vary the first and second capacitances so as to vary the ratio of RF current present in the two segments.

Preferably, adjusting the differential capacitor to increase the first capacitance will proportionally reduce the second capacitance, and vice versa. This variation in the first and second capacitances changes the relative current flow in the first and second sections of the split conductor or parallel segment, and thereby adjusts the orthogonality of the second coil field with respect to the first by altering the proportion of overlapped to non-overlapped areas. The total net capacitance remains essentially constant, and thus the tuning and matching characteristics of the coil system are not materially affected.

In a first preferred embodiment, the capacitors are remotely operable to vary the first and second capacitances such that the capacitors and associated circuitry do not have to be physically disturbed. With the use of a differential capacitor, the ratio of capacitance may further be varied such when the first capacitance is increased, the second capacitance is reduced. Adjusting the capacitance in this manner changes the ratio of the RF current flowing through each segment, causing a sharing of the proper amount of out-of-phase flux to cancel the balance of the shared in-phase flux between the first and second coils. When the differential capacitor is set to an appropriate position, the net shared flux, and therefore the mutual inductance, approach zero.

In another preferred embodiment, the differential capacitor comprises first and second varactor diodes which are disposed in respective parallel segments of the second coil. Variable voltage circuitry is coupled to PN junctions of these diodes to vary the reverse bias on the varactor diodes which thereby adjusts the first and second capacitances. A plurality of potentiometers or other voltage adjustment means within the variable voltage circuitry are supplied in order to vary the voltages appearing at these diodes.

The present invention confers a principal technical advantage in that the orthogonality of RF quadrature coils can be precisely adjusted without disturbing the coils either by making physical adjustments to variable capacitors or by physically moving the coils themselves. Differential adjustment of the voltages on the varactor diodes provides orthogonality adjustment, whilst common mode adjustment of the voltages can be employed to provide tuning adjustment. The present invention has applications in many different types of quadrature magnetic resonance surface coils and/or multicoil systems.

BRIEF DESCRIPTION OF THE DRAWINGS

Other aspects of the invention may be discerned from the following detailed description when read in conjunction with the drawings, in which.

DETAILED DESCRIPTION OF PREFERRED EMBODIMENTS

Figure 1:
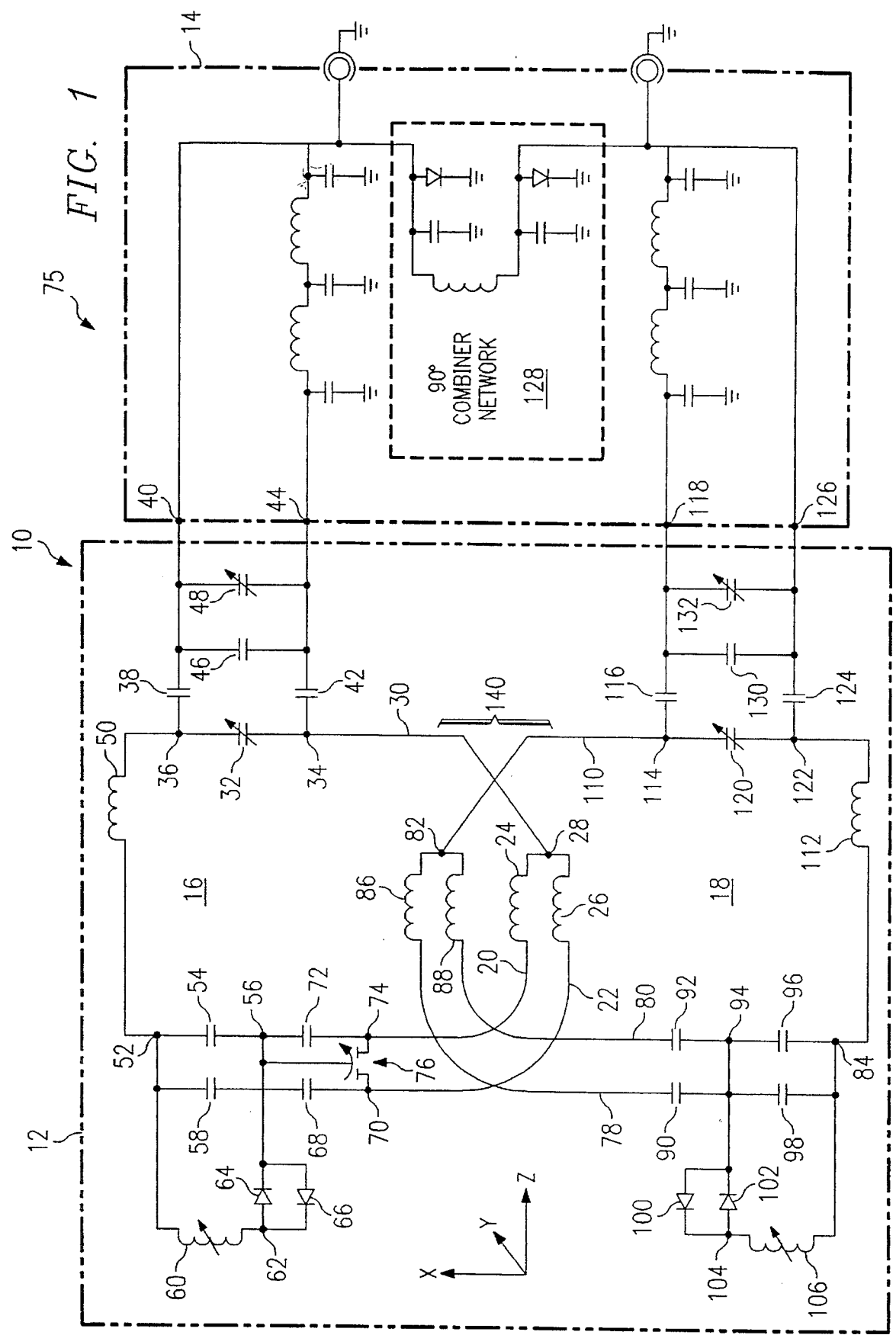
FIG. 1 is an electrical schematic diagram illustrating the invention embodied in a quad cervical-spine coil.

In accordance with the present invention a quadrature magnetic resonance surface coil assembly is disclosed which includes first and second coils with generally perpendicular fields. The first and second coils are mounted parallel to each other and in a preferred embodiment share a critically overlapped area. In the preferred embodiment, each of the coils is intentionally split into two separate parallel segments within the critically overlapped area. It is apparent, however, that the invention would provide satisfactory results if only one of the coils was divided into separate parallel segments, The coils are shaped and positioned so that the mutual inductance and therefore the majority of the coupling between the loops are minimized. This is usually accomplished by physically overlapping a critical portion of the area enclosed by the loops, such that the vector sum of all flux acting on one coil due to the other coil is near zero. However, the positioning of the loops is highly critical and is too sensitive to allow mass-produced devices to perform well without further individual adjustment to compensate for tolerances in physical dimensions and in values of electrical components, The net mutual inductance of coils in a particular individual unit can be reduced to a level approaching zero when a differential capacitor or reactor is placed in series with the parallel segments and is appropriately adjusted. The results of such an individual adjustment can be measured using a network analyzer set to display the S21 (transmission) parameter. With one coil on each analyzer port, the coils are adjusted to minimize the value of S21. In the preferred embodiments, the differential element is a capacitor that can be adjusted to vary the ratio of current in each of the parallel segments of the coils. Isolation and orthogonality between the coils can be adjusted if the adjustable element performs the function of a differential capacitor.

Adjusting the capacitance in series with each of the parallel segments varies the ratio of the RF current flowing through each segment of the loop. This accomplishes an effect equivalent to physically moving the loops to change the amount of overlap area and shared flux. The resulting effective change in the overlapped area effectively changes the ratio of the out-of-phase flux to in-phase flux of the loops.

In another embodiment, the first and second coils are disposed such that a principal electromagnetic field of the first coil is orthogonal to a principal electromagnetic field of the second coil. The split conductor segments and associated differential reactive element serve to adjust the relative orthogonality of the fields of one or more of the coils with respect to the field from another coil or coils. In yet a further embodiment, the split parallel conductors may lay either wholly or partially outside of a critical overlap area. The coil systems according to the invention may be configured as multicoil or phased array coil systems. Some or all of the component coil subsystems may be quadrature coils. Below are described several examples of how the coils may be configured.

FIG. 1 is a schematic diagram illustrating a representative NMR quadrature coil indicated generally at 10. System 10 includes a surface coil circuit 12, indicated by a dashed enclosure, and a balun/combiner circuit 14, also indicated by a dashed enclosure. The surface coil circuit 12 includes a first coil 16 and a second coil 18. Coil 16 includes two split conductors or parallel segments 20 and 22 which are spatially displaced from each other. The inductance of each of the parallel conductor segments 20 and 22 is respectively represented by inductor 24 or 26.

Split conductors 20 and 22 are joined at node 28 to a single conductor 30 which completes the coil loop. A variable capacitor 32 is inserted in series in conductor segment 30 between nodes 34 and 36. A capacitor 38 is inserted in series between node 36 and a port 40 of the balun/computer circuit 14. Likewise, a capacitor 42 is inserted in series between node 34 and a port 44 of the balun/computer circuit 14. A fixed capacitor 46 and a variable capacitor 48 are connected between ports or nodes 40 and 44.

The inductance of coil 30 is represented at 50. Node 52 is the other terminus of split conductors 20 and 22. A capacitor 54 is connected between node 52 and a node 56. A further capacitor 58 is connected between node 52 and node 56. A variable inductor 60 is inserted in series between node 52 and a node 62. Back-to-back diodes 64 and 66 are connected in parallel between node 62 and node 56.

A fixed capacitor 68 is connected between node 56 and a node 70. In the other parallel segment or split conductor 20, a fixed capacitor 72 is connected between node 56 and a node 74. A differential capacitor indicated generally at 76 has three electrodes, two of which are connected to nodes 70 and 74, respectively, and a third of which is connected to the node 56.

Coil 18 likewise has a portion thereof split between parallel conductor segments 78 and 80 between nodes 82 and 84. The inductances of split conductors 78 and 80 are represented at 86 and 88. Fixed capacitors 90 and 92 are respectively connected in series in split conductors 78 and 80. One electrode each of capacitors 90 and 92 is connected to a node 94. A pair of fixed capacitors 96 and 98 is connected in parallel between node 84 and node 94. A pair of back-to-back diodes 100 and 102 connects node 94 to a node 104, which in turn is connected by a variable inductor 106 to the node 84.

A single conductor segment 110 is connected between junction nodes 82 and 84, and its inductance is represented at 112. A node 114 on the single conductor 110 is connected to a fixed capacitor 116, which in turn is connected to a node or port 118 of the balun/combiner circuit 14. A variable capacitor 120 is connected in series between node 114 and a node 122, both of which are on single element conductor 110. The node 122 is connected via a fixed capacitor 124 to a port or node 126 of the balun/combiner circuit 14. The balun/combiner circuit 14, the details of which are mostly unimportant here, includes a 90° combiner network 128. A fixed capacitor 130 and a variable capacitor 132 span the ports 118 and 126 in parallel.

The second pair of parallel segments 78 and 80 form an overlap area with the coil 16 containing parallel segments 20 and 22. By "overlapping" or "overlap," we mean the area of projection of one coil onto the other, where both coils define areas that may or may not be substantially planar, and are positioned with respect to each other such that pan of the area of one coil has a projection onto pan of the area of the other coil. Each of the loops 16 and 18 is split into respective parallel signal path segments 20, 22 and 78, 80 located within critically overlapped area 140. Differential capacitor 76 is connected to segments 20 and 22 to differentially adjust the capacitance in series thereof, and therefore the ratio of the RF current flowing through these paths. Adjusting the relative capacitance in a differential manner allows the isolation to be adjusted without significantly changing other coil parameters such as resonant frequency or impedance matching.

Figure 2:
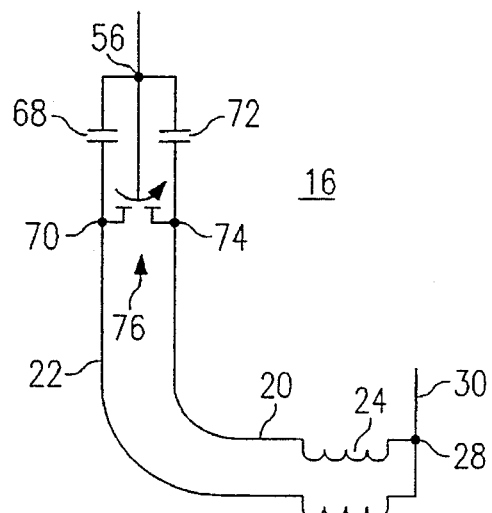
FIG. 2 is a detail of FIG. 1 more particularly showing a differential capacitor.

A detail of the differential capacitor circuit is given in FIG. 2. In FIG. 2, the differential capacitor 76 is placed in line with parallel loop segments 20 and 22. Adjustment of the differential capacitor 76 varies the ratio of RF current flowing through parallel segments 20 and 22 of magnetic resonance coil 16.

The coils 16 and 18 (FIG. 1) are shaped in position such that the mutual inductance and therefore the majority of the coupling between the loops are minimized. This is accomplished by overlapping a critical portion of the area enclosed by the loops, such that the vector sum of all flux acting on one coil due to the other coil is near zero. However, the positioning of the loops 16 and 18 is highly critical and too sensitive to allow mass-produced devices to perform well without further individual adjustment to compensate for tolerances in physical dimensions and in values of electrical components.

To effect individual adjustment of coil system 10, an adjustment is made of differential capacitor 76 once it has been inserted into surface coil circuit 12. The results of such an individual adjustment can be measured using a network analyzer set to display the S21 (transmission) parameter. With coils 16 and 18 on a corresponding analyzer port, the coils are adjusted to minimize the value of S21.

Adjusting the capacitance in series with each of the parallel segments 20, 22 varies the ratio of the RF current flowing through each segment of the loop. This accomplishes an effect equivalent to physically moving the loops to change the amount of overlap area and shared flux. The resulting effective change in the overlapped area effectively changes the ratio of the out-of-phase flux to in-phase flux of the loops.

Figure 3:
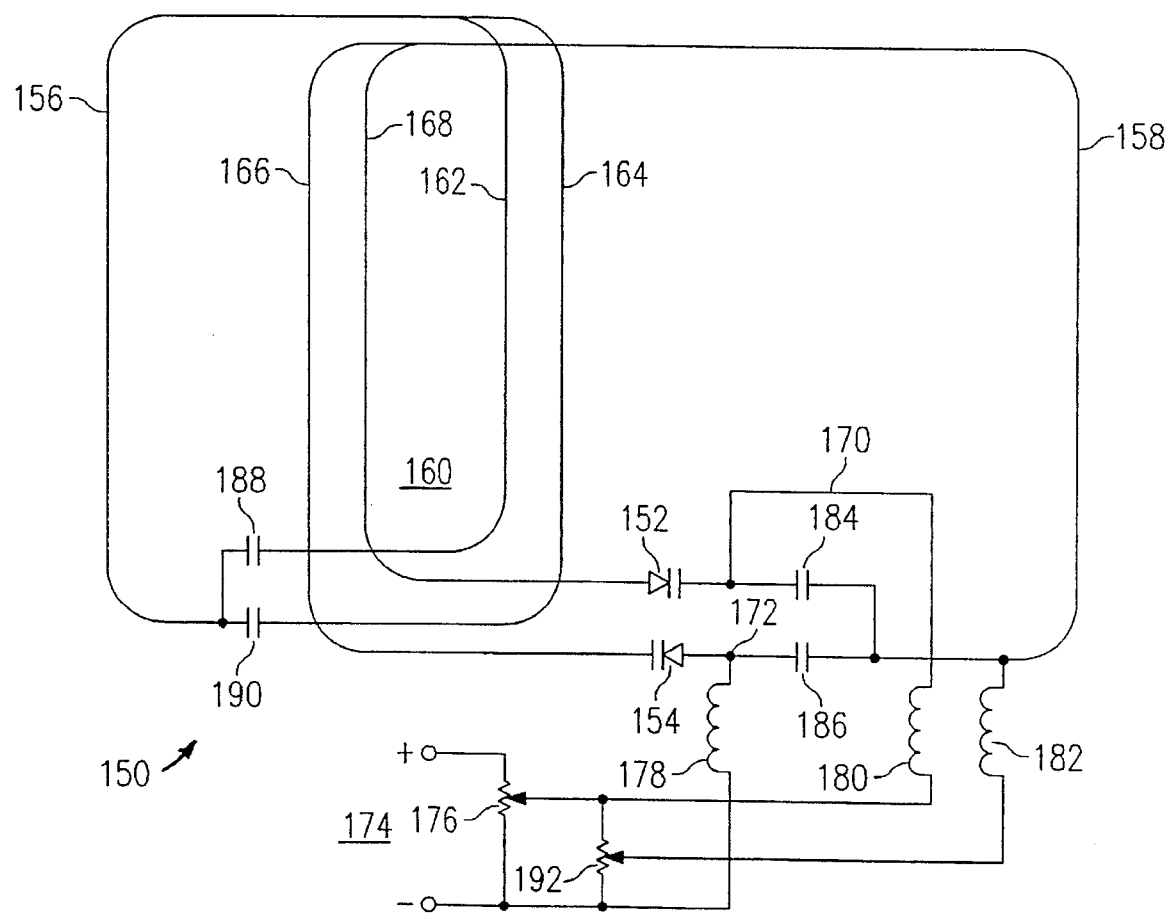
FIG. 3 is an electrical schematic diagram illustrating another NMR quadrature coil pair, varactor diodes making up a differential capacitor for adjusting coil orthogonality, and bias circuitry for control of the varactor diodes.

FIG. 3 is a schematic diagram of an alternative embodiment of the invention, further including a representative NMR quadrature coil pair 150, a pair of varactor dimes 152 and 154 coupled to coil 158, and bias circuitry for control of the electrical adjustment of the quadrature magnetic resonance surface coil pair 150. In this example, two coils 156 and 158 are shown with an overlap area 160. Each of the loops 156 and 158 is split into respective parallel signal path segments 162, 164 and 166, 168 located within a critically overlapped area 160. Varactor diodes 152 and 154 are respectively connected to segments 168 and 166 and act to adjust the capacitance thereof, and therefore the ratio of the RF current flowing through these paths.

The capacitance of varactor diodes 152 and 154 is adjusted by varying the reverse bias voltage on the varactor diodes 152 and 154. The varactor diodes 152 and 154 have a reverse orientation with respect to each other so that adjustment of the reverse bias voltage will have an opposite effect on the capacitance of each varactor diode. The reverse bias voltage is applied to varactor diodes 152 and 154 at nodes 170 and 172.

The bias voltage is supplied from DC voltage source 174 and variable resistor 176. Variable resistor 176 adjusts the capacitance of parallel signal paths 166 and 168 by varying the magnitude of reverse bias on varactor diodes 1.70 and 172. Adjustment of variable resistor 176 alters the capacitance of varactor diodes 152 and 154 in a common mode manner, changing the resonance as if a conventional variable capacitor were employed. The bias voltage is connected through RF chokes 178, 180 and 182 to prevent the loss of RF energy from the resonant circuit of the coils. DC blocking capacitors 184 and 186 prevent the DC bias voltage from creating current flow in the magnetic resonance loop 158. Fixed capacitors 188 and 190 establish a resonance condition in coil loop 156 equivalent to that in loop 158. It is clear that capacitors 188 and 190 could be replaced with a second varactor diode configuration similar to that used on loop 158.

Variable resistor 176 controls the bias voltage applied to both varactor dimes 152 and 154; it provides adjustment to the resonant frequency of the loop without changing the orthogonality adjustment established by the ratio of currents in segments 166 and 168. Variable resistor 192 is connected to the bias voltage output from variable resistor 176 and provides a secondary adjustment of the bias voltage by varying the voltage ratio between varactor dimes 152 and 154. Adjustment of variable resistor 192 varies the capacitance of varactor dimes 152 and 154 in a differential manner, allowing the isolation to be adjusted by changing the ratio of current in segments 166 and 168 without changing the resonant frequency of the coil system, as if a differential capacitor were employed.

Figure 4:
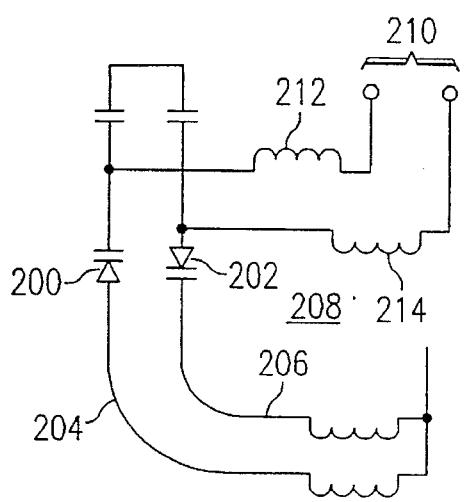
FIG. 4 is an electrical schematic diagram corresponding to FIG. 2, showing how varactor diodes may be used according to the invention.

A differential capacitor is shown generally in FIG. 2 and a functional equivalent thereof, namely a pair of varactor dimes, is shown in FIG. 4. The varactor dime pair 200, 202 of FIG. 4 is interchangeable in function with the differential capacitor circuit 76 of FIG. 2, but with the added ability to be controlled in a common mode manner also to adjust coil tuning. In FIG. 2, the differential capacitor 76 is placed in line with parallel loop segments 20 and 22. Adjustment of the differential capacitor 76 varies the ratio of RF current flowing through parallel segments 20 and 22 of magnetic resonance coil 16.

FIG. 4 shows a pair of varactor dimes 200 and 202 which are placed in line with parallel segments 204 and 206 of magnetic resonance coil 208. The capacitances of varactor dimes 200 and 202 are adjusted by varying a bias voltage 210, which is connected to varactor dimes 200 and 202 through RF dimes 212 and 214, respectively. Adjustment of the bias voltage 210 therefore adjusts the ratio of the RF current flowing through parallel segments of magnetic resonance coil 208. Throughout the remaining FIGUREs, the varactor diode pair 200, 202 and associated bias voltage circuitry may be substituted for each differential capacitor symbol. The illustrated varactor diode pair 200, 202 could be replaced by a differential capacitor 76 of FIG. 1 in the form of a mechanical device with moving plates as actuated by an operator, a motor, or the like.

Figure 5:
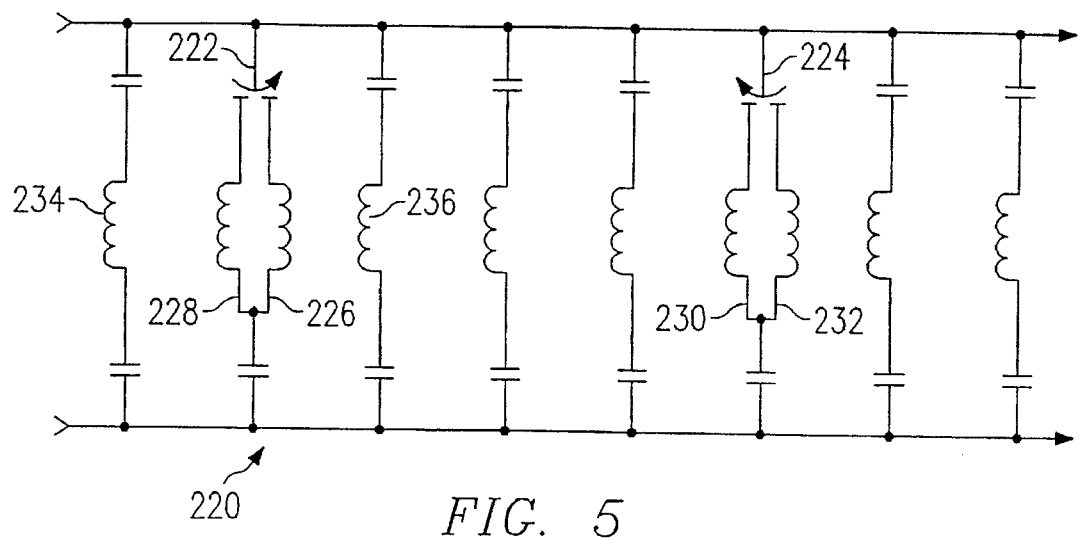
FIG. 5 is an electrical schematic diagram illustrating the invention embodied in a quad birdcage coil.

FIG. 5 shows an application of the present invention to a quad birdcage coil shown generally at 220. First and second differential capacitors 222 and 224 operate in a manner identical to that described previously; however, each differential capacitor is connected to a separate loop with respective parallel segments 226, 228 and 230, 232. Each differential capacitor may be independently tuned as previously discussed to provide the desired isolation of the coils. The differential capacitors may be formed by a pair of varactor diodes as previously described. First and second outputs are available across inductors 234 and 236, respectively.

Figure 6:
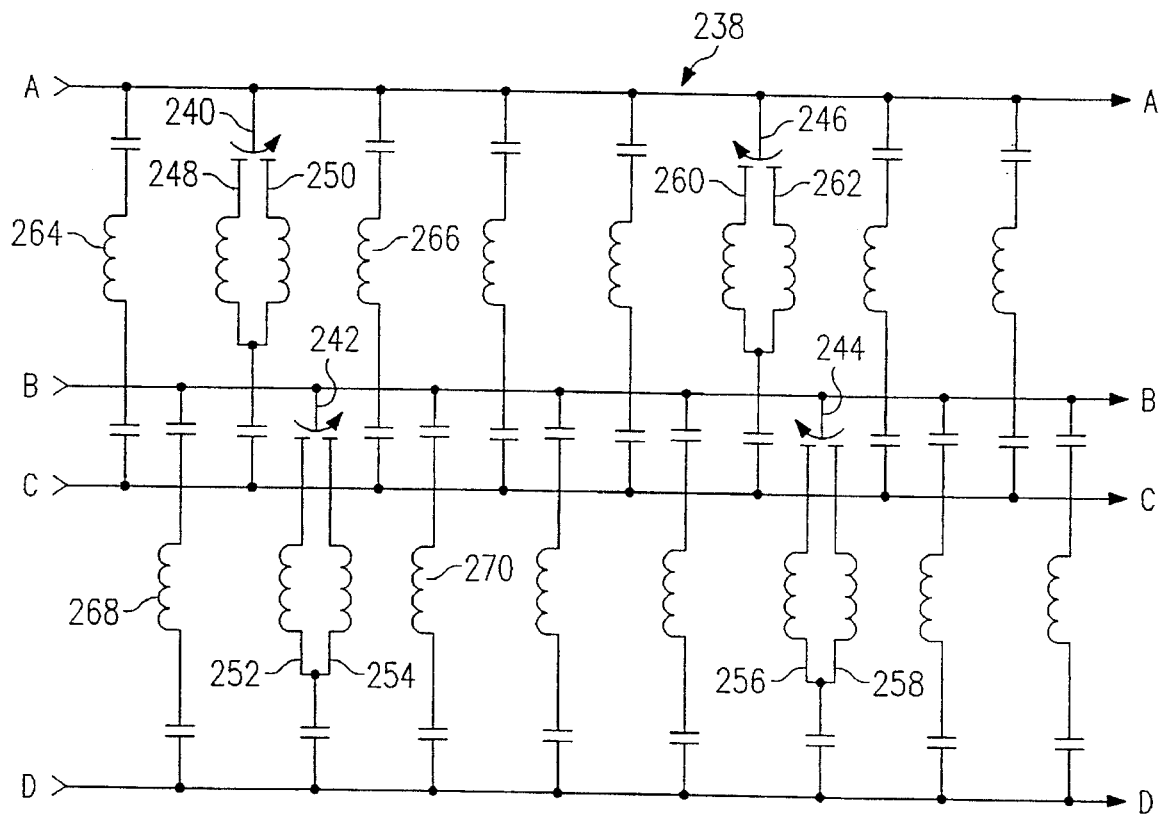
FIG. 6 is an electrical schematic diagram illustrating the invention embodied in a quad multiple port birdcage coil.

FIG. 6 is a schematic diagram illustrating the application of the present invention to a quad multiple port birdcage coil shown generally at 238. In this example four differential capacitors 240, 242, 244, and 246 are employed to provide the desired isolation of respective coil pairs. Each of the differential capacitors is connected to respective parallel segments 248, 250; 252, 254; 256, 258; and 260, 262 to provide for the adjustment of the RF current flowing through the respective paths as previously discussed. As with the other designs it is contemplated that in one embodiment the differential capacitors be formed by pairs of varactor diodes. Output coils 264 and 266 are provided in conjunction with parallel segments 248 and 250. Output coils 268 and 270 are provided in conjunction with parallel segments 252 and 254.

Figure 7:
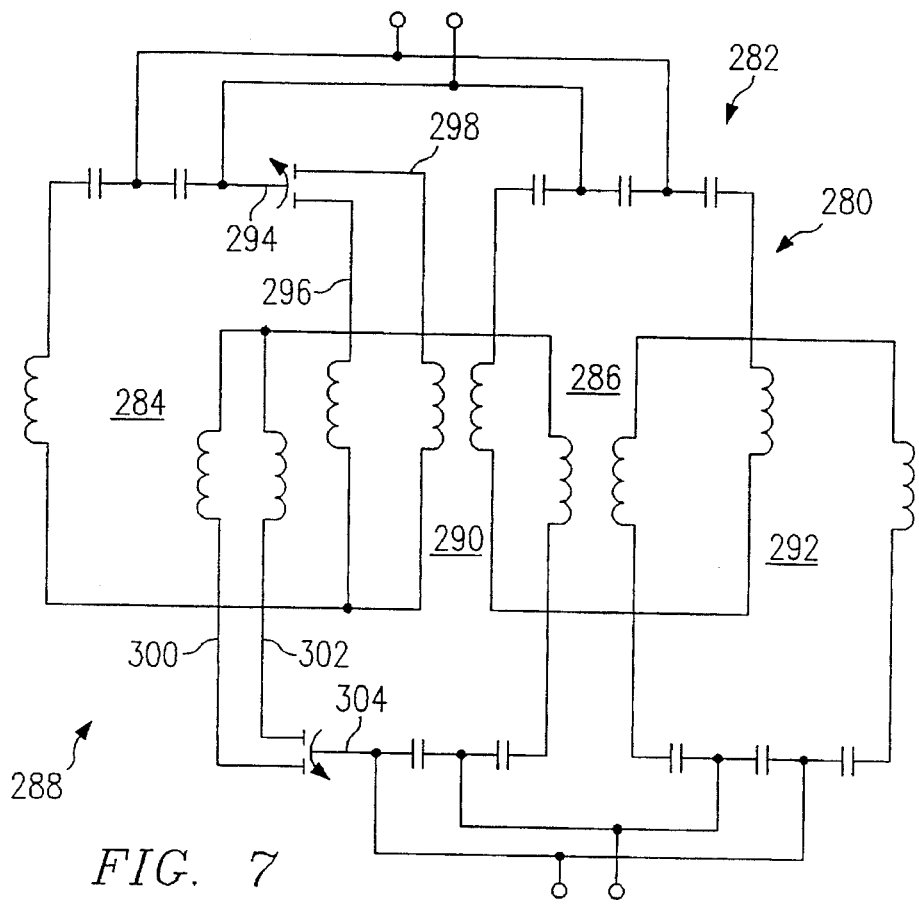
FIG. 7 is an electrical schematic diagram illustrating the invention embodied in a quad saddle coil.

FIG. 7 is a schematic electrical diagram illustrating the application of the present invention to a quad saddle coil design shown generally at 280. A first saddle coil 282 has coil halves 284 and 286. A second saddle coil 288 has coil halves 290 and 292. A differential capacitor 294 is connected to loop segments 296 and 298, which overlap with loop segments 300 and 302 of coil half 290 of second saddle coil 288. A second differential capacitor 304 is connected to loop segments 300 and 302 to increase the tunable range of the coils. In this arrangement, the differential capacitors operate as previously discussed and in one embodiment may be formed by varactor diodes.

Figure 8:
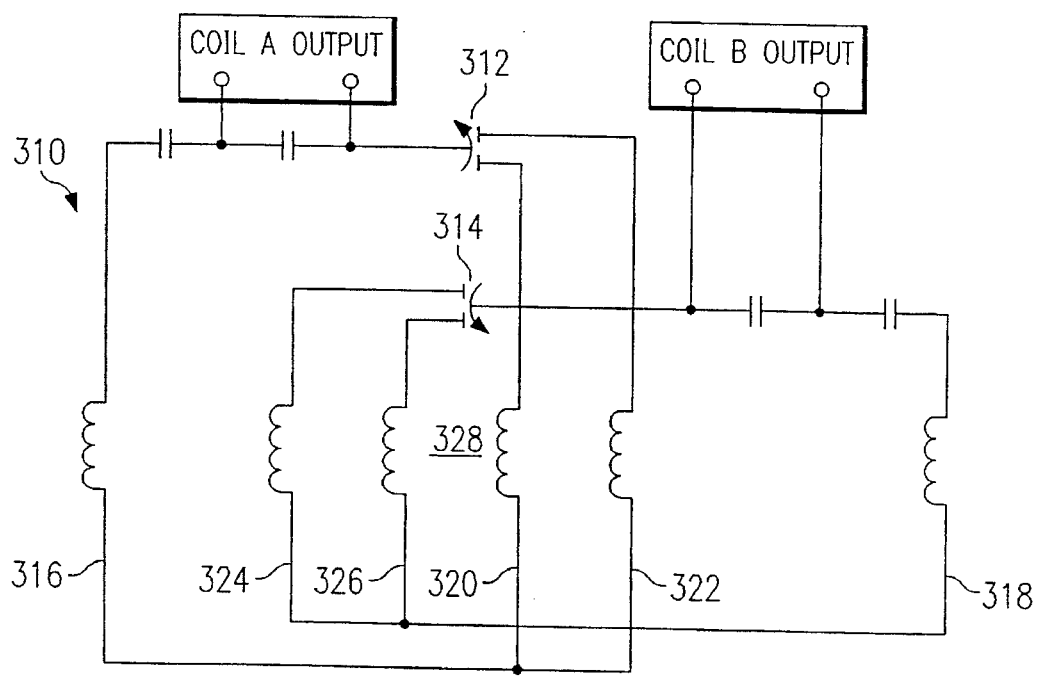
FIG. 8 is an electrical schematic diagram illustrating the invention embodied in a quad multiple port planar coil.

FIG. 8 is a schematic diagram illustrating the present invention embodied in a multiple port planar coil shown generally at 310. The diagram illustrates a pair of differential capacitors 312 and 314 respectively located in line with separate, overlapping coils 316 and 318. Coil 316 is separated into parallel segments 320 and 322. Coil 318 is formed with parallel segments 324 and 326. Segments 320–326 are located within a critically overlapped area 328. The differential capacitors 312 and 314 operate in an identical manner to that previously discussed and may be formed by varactor diodes. In this embodiment differential capacitors 312 and 314 may be adjusted independently or simultaneously to provide the desired isolation of the coils.

Figure 9:
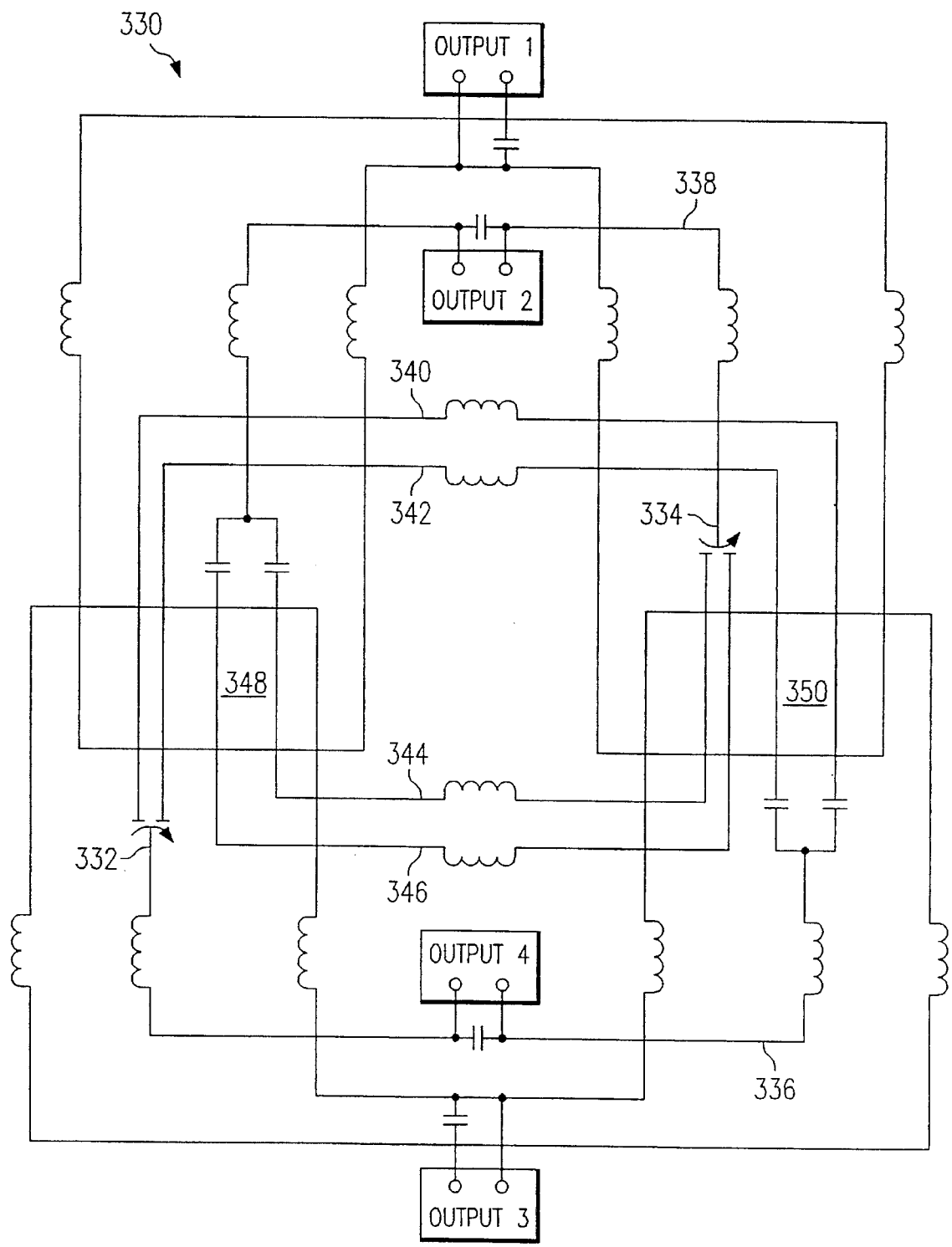
FIG. 9 is an electrical schematic diagram illustrating the invention in use with a quadrature planar multiport coil system.

FIG. 9 is a schematic diagram illustrating the application of the present invention to a quadrature planar multiport coil shown generally at 330. In this example two differential capacitors 332 and 334 are employed to provide the desired isolation of respective coil pairs 336 and 338. Each of the differential capacitors 332 and 334 is connected in series to respective parallel segments 340, 342 and 344, 346 to provide for the adjustment of the RF current ratio flowing through the respective paths as previously discussed. As with other designs, it is understood that more or less pairs of parallel segments in the critically overlapped areas 348, 350 can be used to increase the flexibility of orthogonality and isolation adjustment available. Also as with the other designs it is contemplated that the differential capacitors may be formed by pairs of varactor diodes.

In alternative embodiments, the differential capacitors disclosed in FIGS. 1–9 are replaced by differential reactive elements. These are adjusted in a fashion similar to the adjustments made in the differential capacitors to contribute varying amounts of reactance to related coil segments to thereby achieve coil isolation.

In summary, a novel means of adjusting the orthogonality of fields generated by overlapping quadrature coils, or individual coil systems in a multicoil configuration, is disclosed. However, the above description is not intended to limit the present invention in any way, which is limited only by the scope and spirit of the following claims.

What is claimed is:

1. A magnetic resonance coil system, comprising:
   a first coil;
   a second coil having first and second segments configured in parallel, said second coil disposed with respect to said first coil such that there is a physical overlap of said first and second coils; and
   a differential capacitor contributing a first capacitance in series with said first conductor segment and a second capacitance in series with said second conductor segment, said differential capacitor operable to vary said first and second capacitances such that when one of said first and second capacitances is increased, the other of said first and second capacitances is reduced, thus varying the ratio of RF current in the segments first and second conductor segments.

2. The magnetic resonance coil system of claim 1, wherein said differential capacitor is remotely operable to vary said first and second capacitances.

3. The system of claim 1, wherein said differential capacitor comprises first and second varactor diodes disposed in respective ones of said first and second conductor segments, voltage circuitry coupled to apply a first voltage to said first varactor diode and a second voltage to said first and second capacitances.

4. The system of claim 1, wherein at least a portion of said first and second conductor segments of said second coil are disposed outside of an overlap area between said first and second coils.

5. The system of claim 3, wherein said first coil comprises first coil comprises first and second conductor segments configured in parallel, said system further comprising a second differential capacitor contributing a third capacitance in series with said first conductor segment of said first coil, said second differential capacitor contributing a fourth capacitance in series with said second conductor segment of said first coil, said second differential capacitor operable to vary said third and fourth capacitances and to thus vary the ratio of RF current in the first and second conductor segments of the second coil.

6. The system of claim 5, wherein said system is a quadrature cervical-spine coil system.

7. The system of claim 5, wherein said system is a quadrature saddle coil system.

8. The system of claim 3, wherein said system is a quadrature cervical-spine coil system.

9. The system of claim 3, wherein said system is a quadrature saddle coil system.

10. The system of claim 3, wherein said voltage circuitry comprises means for controlling the voltages on the varactor diodes in a differential mode to effect orthogonality adjustment and means for controlling the voltages on the varactor diodes in a common mode to effect tuning.

11. The system of claim 1, wherein said first coil has first and second conductor segments configured in parallel, all of said conductor segments of said first and second coil disposed within an overlap area.

12. The system of claim 1, wherein said system is a multiple port planar coil system.

13. The system of claim 1, wherein said system is a quadrature birdcage coil system.

14. The system of claim 1, wherein said system is a quadrature multiple port birdcage coil system.

15. A magnetic resonance imaging system, comprising:

a surface coil having first and second conductor segments connected in parallel; and a differential capacitor having a first capacitance coupled to said first conductor segment and a second capacitance coupled to said second conductor segment, said differential capacitor being remotely controllable to differentially change said first and second capacitances such that when one of said first and second capacitances is increased, the other of said first and second capacitances is reduced.

16. A magnetic resonance imaging system, comprising:

a plurality of surface coils each having first and second conductor segments connected in parallel; and for each of said surface coils, a differential capacitor having a first capacitance coupled to said first conductor segment of the last said surface coil and a second capacitance coupled to said second conductor segment of the last said surface coil, said differential capacitor being remotely controllable to differentially change said first and second capacitances such that when one of said first and second capacitance is increased, the other of said first and second capacitances is reduced.

17. A quadrature magnetic resonance coil system, comprising:

a first coil;

a second coil physically overlapping said first coil and having first and second conductor segments connected in parallel;

a first capacitor providing a first capacitance to said first conductor segment; and a second capacitor providing a second capacitance to said second conductor segment, said first and second capacitors variable to adjust the current flowing in said first and second conductor segments.

18. A method for adjusting quadrature magnetic resonance surface coils, comprising the steps of:

locating first and second magnetic resonance surface coils such that said first and second coils have an area of overlap;

selectively directing the current of the first of said magnetic resonance surface coils between two parallel conductor segments of the first coil located in the area of overlap; and varying the capacitance of said parallel conductor segments to adjust the isolation of said magnetic resonance surface coils.

19. A method for adjusting quadrature magnetic resonance surface coils, comprising the steps of:

within a critical area of overlap of first and second coils, dividing at least the first coil into first and second parallel conductor segments;

coupling a differential capacitor to the first coil such that the differential capacitor contributes a first capacitance to the first conductor segment and a second capacitance to the second conductor segment; and varying the first and second capacitances to adjust the orthogonality of the first coil with respect to the second coil.

20. The method of claim 19, and further comprising the steps of:

forming the differential capacitor by a first varactor diode coupled to the first conductor segment and a second varactor diode coupled to the second conductor segment; and varying voltages applied to the first and second varactor diodes to respectively adjust the first and second capacitances.

21. A quadrature magnetic resonance coil system, comprising:

a first coil;

a second coil having first and second conductor segments connected in parallel, said second coil disposed with respect to said first coil such that there is an overlap of said first and second coils; and differential means for varying reactance contributing a first reactance to said first conductor segment and a second reactance to said second conductor segment, said differential means operable to vary said first and second reactances.

22. A magnetic resonance coil system, comprising:

a first coil;

a second coil disposed such that a principal electromagnetic field of said first coil is orthogonal to a principal electromagnetic field of said second coil, said second coil including first and second conductor segments configured in parallel; and a differential capacitor contributing a first capacitance in series with said first conductor segment and a second capacitance in series with said second conductor segment, said differential capacitor operable to vary said first and second capacitances so as to adjust the relative orthogonality of the electromagnetic fields of said first and second coils.

23. The magnetic resonance coil system of claim 1, wherein said first and second coils are quadrature coils.

24. The magnetic resonance coil system of claim 1, wherein said first and second coils are a portion of a phased array coil system.

* * * * *